(12) United States Patent
Park et al.

(10) Patent No.: US 11,380,875 B2
(45) Date of Patent: Jul. 5, 2022

(54) DISPLAY APPARATUS AND METHOD OF MANUFACTURING THE SAME

(71) Applicant: SAMSUNG DISPLAY CO., LTD., Yongin-si (KR)

(72) Inventors: Kwangwoo Park, Hwaseong-si (KR); Junhyuk Woo, Yongin-si (KR); Hyeonbum Lee, Hwaseong-si (KR); Eonjoo Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 35 days.

(21) Appl. No.: 16/822,196

(22) Filed: Mar. 18, 2020

(65) Prior Publication Data

US 2020/0321561 A1 Oct. 8, 2020

(30) Foreign Application Priority Data

Apr. 3, 2019 (KR) .................. 10-2019-0038936

(51) Int. Cl.
*H01L 51/52* (2006.01)
*H01L 27/32* (2006.01)
*H01L 51/56* (2006.01)

(52) U.S. Cl.
CPC ...... *H01L 51/5281* (2013.01); *H01L 51/5253* (2013.01); *H01L 51/5275* (2013.01); *H01L 51/56* (2013.01)

(58) Field of Classification Search
CPC ......... G02F 1/136227; G02F 1/136209; H01L 51/56; H01L 51/5253; H01L 51/5284;
(Continued)

(56) References Cited

U.S. PATENT DOCUMENTS 5,698,462 A * 12/1997 Sasaki ................ H01L 23/552
257/E21.597
2001/0028105 A1* 10/2001 Hashimoto .......... H01L 23/481
257/686
(Continued)

FOREIGN PATENT DOCUMENTS

CN 108540603 5/2018
CN 108881543 11/2018
(Continued)

OTHER PUBLICATIONS

Extended European search report dated Aug. 3, 2020 from the European Patent Office in correspondng European Patent Application No. 20167669.9.

*Primary Examiner* — Caridad Everhart
(74) *Attorney, Agent, or Firm* — F. Chau & Associates, LLC

(57) ABSTRACT

A display apparatus includes a display panel including an opening area through which light passes, a non-display area including an opening peripheral area that is around a periphery of the opening area, and a display area including at least one pixel, the display area being around a periphery of the opening peripheral area, an optical film layer disposed on the display panel, and a cover window disposed on the optical film layer. The display panel includes a base substrate, a light emitting structure disposed on the base substrate, a planarization insulating layer disposed on the substrate in the opening peripheral area, and a light blocking pattern disposed on the planarization insulating layer in the opening peripheral area.

24 Claims, 11 Drawing Sheets

(58) Field of Classification Search
CPC ............. H01L 51/5275; H01L 27/3272; H01L 27/3234; H01L 27/3262; H01L 27/3248; H01L 51/0096; H01I 51/5275; H01I 51/3272; H01I 51/0096

See application file for complete search history.

(56) References Cited

U.S. PATENT DOCUMENTS

| | | | |
|---|---|---|---|
| 2012/0099048 A1* | 4/2012 | Yamazaki | ............... H01L 33/50 349/62 |
| 2012/0106063 A1* | 5/2012 | Mathew | ................ G06F 1/1605 361/679.21 |
| 2018/0033362 A1* | 2/2018 | Yamazaki | ............ G09G 3/2074 |
| 2018/0151834 A1 | 5/2018 | Kanaya | |
| 2020/0144535 A1* | 5/2020 | Kim | .................... H01L 51/5256 |
| 2020/0174598 A1 | 6/2020 | Kanaya | |
| 2020/0194714 A1* | 6/2020 | Won | .................... H01L 27/3225 |
| 2020/0212147 A1* | 7/2020 | Han | .................... H01L 51/0096 |
| 2020/0292882 A1* | 9/2020 | Nakamura | ........ G02F 1/136286 |

FOREIGN PATENT DOCUMENTS

| | | |
|---|---|---|
| CN | 109411519 | 3/2019 |
| EP | 3454389 | 3/2019 |
| KR | 10-2018-0063633 | 6/2018 |
| WO | 2019031024 | 2/2019 |

\* cited by examiner

DISPLAY APPARATUS AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2019-0038936, filed on Apr. 3, 2019, the disclosure of which is incorporated by reference in its entirety herein.

BACKGROUND

1. Technical Field

Embodiments of the inventive concept relate to a display apparatus and a method of manufacturing the display apparatus. More particularly, embodiments of the inventive concept relate to a display apparatus and a method of manufacturing the display apparatus capable of improving a display quality.

2. Discussion of Related Art

Flat panel display apparatuses such as a plasma display apparatus, a liquid crystal display apparatus and an organic light emitting display apparatus have a smaller size, a lighter weight and use less power than traditional cathode ray tube (CRT) display apparatuses.

As an attempt to enlarge the display area of the display apparatus, a bezeless display apparatus and a display apparatus having a notch have been developed. The bezeless display apparatus can have an extremely thin bezel on three sides of the display panel with a thin bezel on the top side to house sensors such as a camera. The display apparatus having the notch can have a thin bezel on three sides of the display panel, a thick bezel (i.e., the notch) in a middle portion of the top side for the sensors, and a thin bezel in left and right portions of the top side adjacent the middle portion. Recently, a display apparatus has been developed with a thin bezel including a hole in an active area of the display panel to house the sensor. However, a display apparatus having the hole may have a reduced display quality as compared to other types of displays.

SUMMARY

At least one embodiment of the inventive concept provides a display apparatus with improved display quality and an enlarged display area.

At least one embodiment of the inventive concept provides a method of manufacturing the display apparatus.

According to an embodiment of the inventive concept, a display apparatus includes a display panel, an optical film layer, and a cover window. The display panel includes an opening area through which light passes, a non-display area including an opening peripheral area that is around a periphery of the opening area, and a display area including at least one pixel. The display area is around a periphery of the opening peripheral area. The optical film layer is disposed on the display panel. The cover window is disposed on the optical film layer. The display panel includes a base substrate, a light emitting structure disposed on the base substrate, a planarization insulating layer disposed on the substrate in the opening peripheral area, and a light blocking pattern disposed on the planarization insulating layer in the opening peripheral area.

In an embodiment, the display apparatus further includes an optical module disposed to overlap the opening area.

In an embodiment, the light blocking pattern includes a photoresist composition.

In an embodiment, the base substrate includes at least one polyimide layer and at least one barrier layer alternately stacked with each other.

In an embodiment, the base substrate includes a groove in the opening peripheral area that is around a periphery of the opening area.

In an embodiment, the optical film includes a polarizing film layer and an adhesive layer disposed between the polarizing film layer and the cover window.

In an embodiment, the display apparatus further includes a dam disposed on the base substrate in the opening peripheral area, and being around a periphery of the opening area, and a thin film encapsulation layer including a first inorganic layer disposed on the light emitting structure, an organic layer disposed on the first inorganic layer, and a second inorganic layer disposed on the organic layer, where the organic layer is only disposed outside the dam with reference to the opening area.

In an embodiment, the display panel and the optical film layer include a through-hole, and the optical module includes a lens portion and a body portion, where a portion of the lens portion is disposed in the through-hole, and the body portion is disposed under the display panel.

In an embodiment, a distance between an upper surface of the lens portion and the cover window is smaller than a distance between the light blocking pattern and the cover window.

In an embodiment, the base substrate and the light blocking pattern include a hole and the light blocking pattern contacts the hole.

According to an embodiment of the inventive concept, a method of manufacturing a display apparatus includes: forming a thin film transistor on a base substrate in a display area, wherein the base substrate includes an opening area, a opening peripheral area that is around a periphery of the opening area, and the display area is around a periphery of the opening peripheral area; forming a light emitting structure electrically connected to the thin film transistor; forming a thin film encapsulation layer on the light emitting structure; forming a planarization layer on the thin film encapsulation layer in the opening peripheral area; and forming a light blocking layer on the planarization layer in the opening peripheral area.

In an embodiment, forming the light blocking layer includes forming a light blocking pattern layer by coating a photoresist composition on the planarization layer; and exposing and developing the light blocking pattern layer to form the light blocking pattern.

In an embodiment, the light blocking pattern layer includes a negative type photoresist composition in which an unexposed portion is developed, and the light blocking pattern layer is exposed using a mask having an opening corresponding to the opening area.

In an embodiment, the method further includes forming a hole corresponding to the opening area by removing a portion of the light blocking pattern, a portion of the planarization layer, a portion of the thin film encapsulation layer, and a portion of the base substrate, after forming the light blocking pattern.

In an embodiment, the method further includes forming a dam disposed on the base substrate in the opening peripheral area to be around a periphery of the opening area in a plan view, before forming the thin film encapsulation layer.

In an embodiment, forming the thin film encapsulation layer includes forming a first inorganic insulating layer on the light emitting structure, and the dam; forming an organic layer on the first inorganic layer outside the dam in a plan view; and forming a second inorganic insulating layer on the organic layer and the first inorganic layer.

In an embodiment, the method further includes forming a groove on the base substrate that is around a periphery of the opening area in the opening peripheral area, before forming the thin film encapsulation layer.

In an embodiment, forming the light emitting structure includes forming a first electrode electrically connected to the thin film transistor; forming a light emitting layer on the first electrode; and forming a second electrode on the light emitting layer.

In an embodiment, the method further includes forming an optical film layer on the light blocking pattern and thin film encapsulation layer; and forming a cover window on the optical film layer.

In an embodiment, the method further includes forming an optical module to overlap the opening area.

According to an embodiment of the inventive concept, a display apparatus includes a display panel, a polarizer, and a cover window. The display panel includes an opening area through which light passes, a non-display area including an opening peripheral area that is around a periphery of the opening area, and a display area including at least one pixel. The display area is around a periphery of the opening peripheral area. The polarizer is disposed on the display panel. The cover window is disposed on the polarizer. The display panel includes light blocking pattern disposed between the polarizer and the display panel in the opening peripheral area, the light blocking pattern being around a periphery of an opening within the opening area.

In an embodiment, the display panel further includes a camera including a body portion and a lens portion, the camera disposed under the display panel, the body portion disposed within the opening peripheral area, where the lens portion is located in the opening area.

In an embodiment, an upper surface of the lens portion is below the light blocking pattern.

In an embodiment, an upper surface of the lens portion is above the polarizer.

According to at least one embodiment of the present inventive concept, a display apparatus includes a light blocking pattern. The light blocking pattern is formed to be in contact with a hole of a display panel forming an opening area. Even if an assembly tolerance between an optical module (e.g., an optical sensor or camera) and the hole of the opening area is considered, a distance between the light blocking pattern and an edge of a lens portion of the optical module in a plan view can be minimized.

In addition, the light blocking pattern may be formed to correspond to an opening peripheral area. Since a vertical distance between a light emitting structure of a pixel closest to the opening peripheral area and a light blocking pattern is relatively small, a light emission range is not limited by the light blocking pattern. Therefore, a distance in a plan view between the light-blocking pattern and the light emitting structure of the closest pixel can be minimized.

BRIEF DESCRIPTION OF THE DRAWINGS

The inventive concept will become more apparent by describing in detail embodiments thereof with reference to the accompanying drawings, in which.

DETAILED DESCRIPTION OF THE EXEMPLARY EMBODIMENTS

Hereinafter, embodiment of the inventive concept will be explained in detail with reference to the accompanying drawings.

Figure 1:
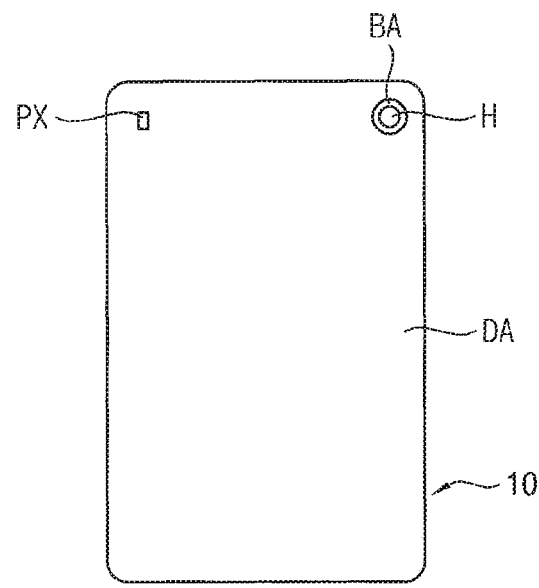
FIG. 1 is a plan view illustrating a display panel of a display apparatus according to an embodiment of the inventive concept.
Figure 2:
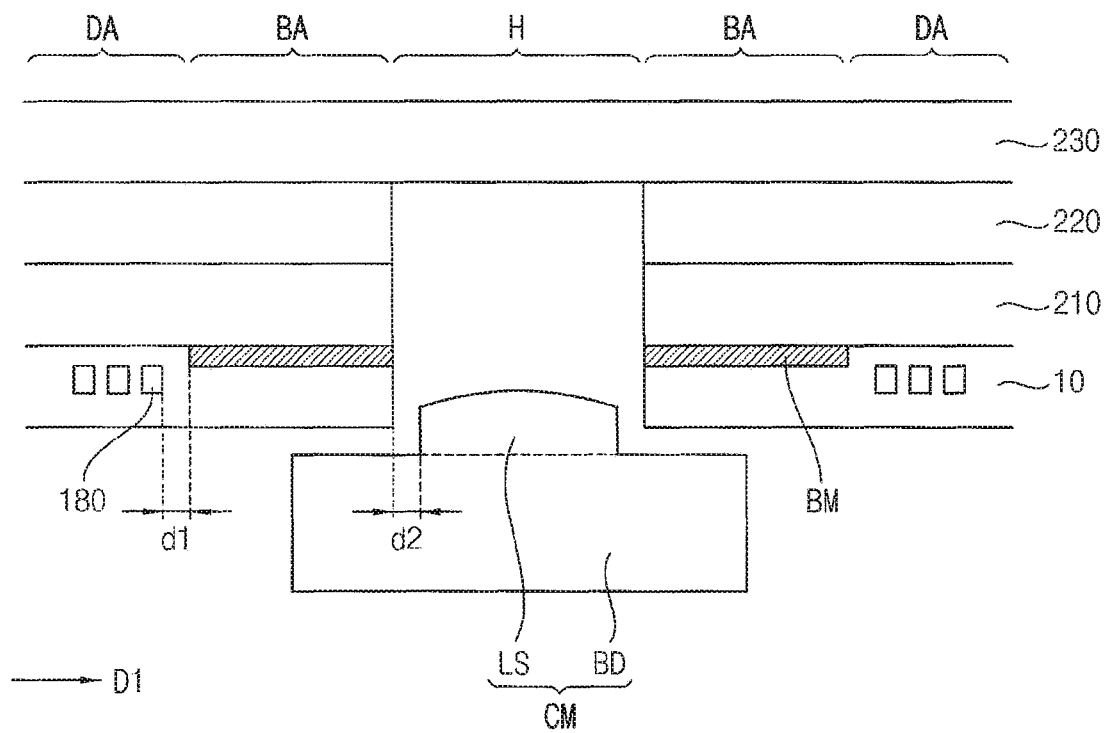
FIG. 2 is a cross-sectional illustrating opening area H and an opening peripheral area BA of the display apparatus of FIG. 1.

FIG. 1 is a plan view illustrating a display panel of a display apparatus according to an embodiment of the inventive concept. FIG. 2 is a cross-sectional illustrating opening area H and an opening peripheral area BA of the display apparatus of FIG. 1.

Referring to FIGS. 1 and 2, the display apparatus includes a display area DA, an opening area H, and a non-display area including an opening peripheral area BA that is around a periphery of the opening area H. The opening peripheral area BA may be surrounded by the display area DA. Although not shown, a peripheral area, which is a non-display area in which no image is displayed may be formed along one or more edges of the display area DA. For example, there may be a very thin bezel that is around a periphery of the display area DA.

A plurality of pixels PX may be arranged in the display area DA to display an image. The display area DA may have a rectangular shape in a plane formed by a first direction D1 and a second direction D2 perpendicular to the first direction D1. In addition, corners of the display area DA may have a rounded shape. Each of the pixels PX may include a thin film transistor (see TFT in FIG. 3) and a light emitting structure (see 180 in FIG. 3) for displaying the image.

The opening area H can transmit light. For example, in the opening area H, a circular hole penetrating a base substrate 100 of a display panel 10 of the display apparatus may be formed. Alternately, a transparent window formed of a material capable of transmitting light can be formed in the opening area H. For example, the transparent window could be formed of glass or plastic.

An optical module CM (e.g., an optical sensor) may be disposed to overlap the opening area H. For example, the optical module CM may include a camera module for capturing (or recognizing) an image of an object, a face recognition sensor module for sensing a face of a user, a pupil recognition sensor module for sensing a pupil of a user, acceleration and geomagnetic sensor modules for determining movement of the display apparatus, proximity and infrared sensor modules for detecting proximity to the display apparatus, and a light intensity sensor module for measuring a degree of brightness. For example, when the display apparatus is left in a pocket or a bag, the light intensity sensor module may detect that the degree of brightness has decreased.

In the present embodiment, the optical module CM is a camera module (e.g., a camera). In an embodiment, the camera module includes a body portion BD disposed under the display panel 10, and a lens portion LS disposed in the opening area H and connected to the body portion BD.

Referring to FIG. 2, the display apparatus includes a display panel 10 in which the pixel PX is formed, a cover window 230 disposed on the display panel 10, and an optical film layer disposed between the display panel 10 and the cover window 230.

The display panel 10 may include a plurality of pixels for displaying an image. Each of the pixels may include the thin film transistor and the light emitting structure 180.

In an embodiment of the inventive concept, the display panel further includes a light blocking pattern BM. In an embodiment, the light transmittance of the light blocking pattern BM is significantly lower than the light transmittance of the display panel 10, the optical film layer, and the cover window 230. In an embodiment, the thickness of the light blocking pattern BM in a plan view is less than the thickness of the display panel 10 in a plan view. In an embodiment, in a plan view, the light blocking pattern BM has a somewhat annulus shape. The light blocking pattern BM may be disposed in the opening peripheral area BA so as to be around a periphery of the opening area H. Since the pixels for displaying an image are not formed in the opening peripheral area BA that is a non-display area, structures in the opening peripheral area BA can be viewed by the user when the light blocking pattern BM is not present. Therefore, the light blocking pattern BM may be formed to cover the structures.

In an embodiment, the light blocking pattern BM is formed to be in contact with the hole of the display panel 10 forming the opening area H. Even if an assembly tolerance between the optical module CM and the hole of the opening area H is considered, the distance d2 between the light blocking pattern BM and an edge of the lens portion LS of the optical module CM in a plan view, can be minimized. In an embodiment, as shown in FIG. 2, the lens portion LS extends into the opening area H, but does not extend beyond the light blocking pattern BM.

In addition, the light blocking pattern BM is formed on the uppermost layer of the display panel 10 and is disposed below the optical film layer. Therefore, the distance between the light blocking pattern BM and the lens portion LS of the optical module CM in a perpendicular direction (that is a direction perpendicular to the first and second direction) to the light blocking pattern BM may be smaller than a case where the light blocking pattern BM is formed closer to the cover window 230. Accordingly, interference with an angle of view of the lens portion LS is reduced, and as a result, the size of the opening area H can be reduced.

The light blocking pattern BM may be formed to correspond to the opening peripheral area BA. Since a vertical distance between the light emitting structure 180 of a pixel closest to the opening peripheral area BA and the light blocking pattern BM is relatively small, a light emission range is not limited by the light blocking pattern BM. Therefore, a distance d1 in a plan view between the light-blocking pattern BM and the light emitting structure 180 of the closest pixel can be minimized.

In an embodiment, the optical film layer includes a polarizing film layer 210 and an adhesive layer 220.

The polarizing film layer 210 may include a polarizing layer and an adhesive layer (not shown). The polarizing layer may change characteristics of light transmitted through it. The polarizing film layer 210 may be attached to the display panel 10 by the adhesive layer.

The adhesive layer 220 may bond the cover window 230 and the polarizing film layer 210 to each other. The adhesive layer 220 may include at least one of a pressure sensitive adhesive (PSA), an optical clear adhesive (OCA), and an optical clear resin (OCR).

The cover window 230 may be disposed on the adhesive layer 220. The cover window 230 may be formed of glass or a plastic material, but is not limited thereto. Meanwhile, the cover window 230 may be formed as a single layer or may be a laminate in which a plurality of functional layers are stacked.

The optical film layer includes a hole corresponding to the opening area H. Thus, the display panel 10 and the optical film layer except for the cover window 239 have holes corresponding to the opening area H.

Figure 3:
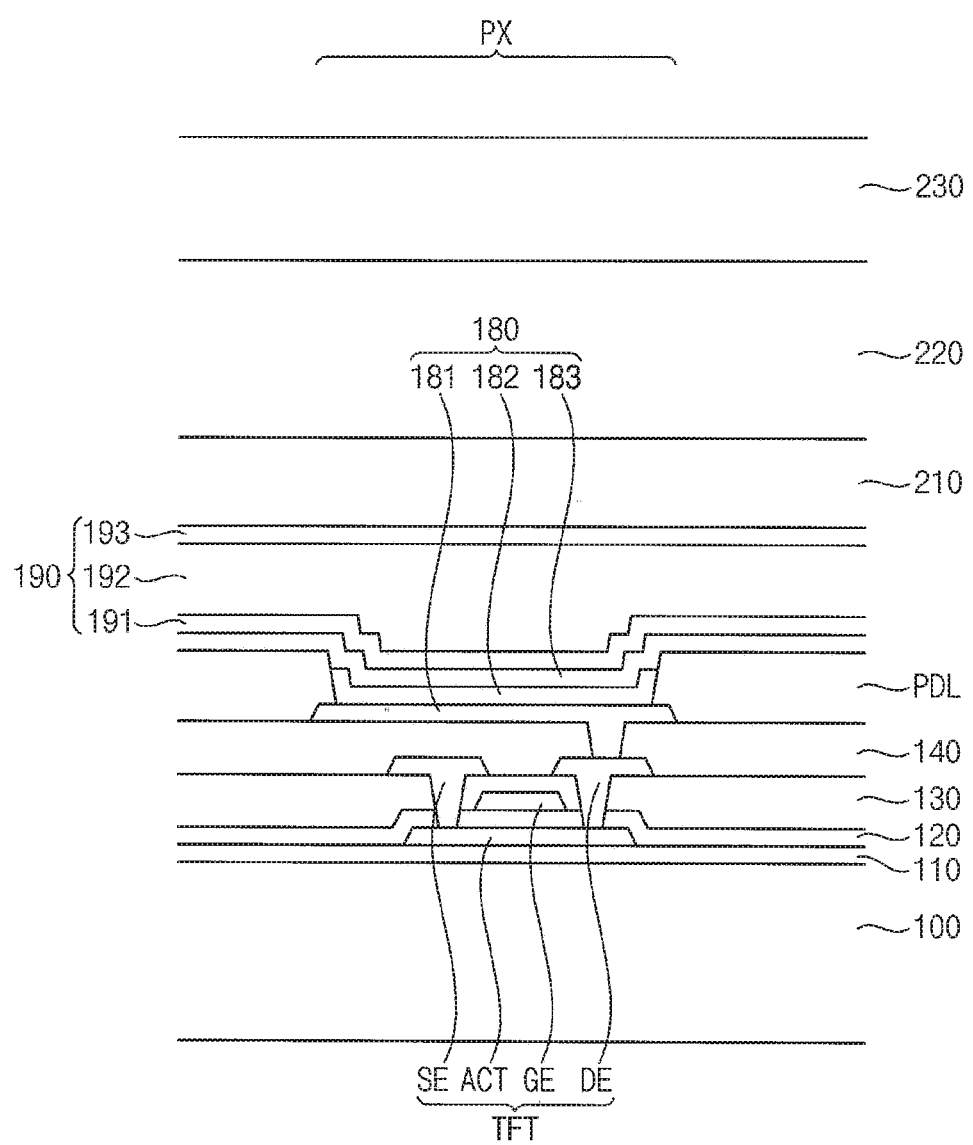
FIG. 3 is a cross-sectional view illustrating a pixel PX of the display apparatus of FIG. 1.

FIG. 3 is a cross-sectional view illustrating a pixel PX of the display apparatus of FIG. 1 according to an embodiment of the inventive concept.

Referring to FIG. 3, the display panel 10 includes a base substrate 100, a buffer layer 110, an active pattern ACT, a gate insulating layer 120, a gate pattern, an interlayer insulating layer 130, a data pattern, a via insulating layer 140, a pixel defining layer PDL, a light emitting structure 180 and a thin film encapsulation layer 190.

The base substrate 100 may be made of a transparent or opaque material. For example, the base substrate 100 may be a quartz substrate, a synthetic quartz substrate, a calcium fluoride substrate, a fluorine-doped quartz substrate, a sodalime glass substrate, or an alkali-free non-alkali glass substrate. Alternatively, the base substrate 100 may be made of a transparent resin substrate. An example of the transparent resin substrate that can be used for the base substrate 100 is a polyimide substrate. For example, the substrate 100 may have a structure in which at least one polyimide layer and at least one barrier layer are alternately stacked.

The buffer layer 110 may be disposed entirely on the base substrate 100. The buffer layer 110 may prevent metal atoms or impurities from diffusing into the active pattern ACT from the base substrate 100 and may control a heat transfer rate during a crystallization process to form the active pattern ACT, thereby obtaining the active pattern ACT which is substantially uniform.

The active pattern ACT of a thin film transistor TFT may be disposed on the buffer layer 110. The active pattern ACT may include amorphous silicon or may include polycrystalline silicon. In some embodiments, the active pattern ACT may include at least one of indium (In), gallium (Ga), stannium (Sn), zirconium (Zr), vanadium (V), hafnium (Hf), cadmium (Cd), germanium (Cr), titanium (Ti), and zinc (Zn). The active pattern ACT may include drain and source regions doped with impurities and a channel region between the drain region and the source region.

The gate insulating layer 120 may be disposed on the buffer layer 110. The gate insulating layer 120 may cover the active pattern ACT on the buffer layer 110 and may be disposed at substantially the same thickness along the profile of the active pattern ACT. The gate insulating layer 120 may include a silicon compound or a metal oxide. The gate insulating layer 120 may be formed of a plurality of layers.

The gate pattern may be disposed on the gate insulating layer 120. The gate pattern may include a gate electrode GE of the thin film transistor TFT and a signal wiring such as a scan line. The gate electrode GE may overlap with the active pattern ACT. For example, the gate electrode GE may overlap with the active pattern ACT in a plan view with a portion of the gate insulating layer 120 disposed therebetween. The gate pattern may be formed using a metal, an alloy, a metal nitride, a conductive metal oxide, or a transparent conductive material.

The interlayer insulating layer 130 may be disposed on the gate insulating layer 120 on which the gate pattern is disposed. For example, the interlayer insulating layer 130 may sufficiently cover the gate pattern on the gate insulating layer 120, and may have a substantially flat upper surface without forming a step around the gate pattern. Alternatively, the interlayer insulating layer 130 may cover the gate pattern on the gate insulating layer 120, and may be disposed at substantially the same thickness along the profile of the gate pattern. The interlayer insulating layer 130 may be formed of a plurality of layers. For example, the gate electrode GE may be disposed between the interlayer insulating layer 130 and the gate insulating layer 120.

The data pattern may be disposed on the interlayer insulating layer 130. The data pattern may include source and drain electrodes SE and DE of the thin film transistor TFT connected to the active pattern ACT through contact holes formed through the interlayer insulating layer 130 and the gate insulating layer 120 and a signal wiring such as a data line. The data pattern may be formed using a metal, an alloy, a metal nitride, a conductive metal oxide, or a transparent conductive material.

The via insulating layer 140 may be disposed on the interlayer insulating layer 130 on which the data pattern is disposed. The via insulating layer 140 may have a single-layer structure, but is not limited thereto. For example, in an alternate embodiment, the via insulating layer 140 has a multi-layer structure including at least two insulating layers. The via insulating layer 140 may be formed using an organic material such as a photoresist, an acrylic resin, a polyimide resin, a polyamide resin, or a siloxane-based resin. According to other embodiments, the via insulating layer 140 may be formed using an inorganic material such as a silicon compound, metal, or metal oxide.

In an embodiment, the light emitting structure 180 includes a first electrode 181, an emission layer 182 and a second electrode 183.

The first electrode 181 may be disposed on the via insulating layer 140. The first electrode 181 may include a reflective material or a transmissive material in accordance with the emission type of the display apparatus. For example, the first electrode 181 may be formed using materials such as aluminum, an alloy containing aluminum, aluminum nitride, silver, an alloy containing silver, tungsten, tungsten nitride, copper, an alloy containing copper, nickel, an alloy containing nickel, chrome, chrome nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in a combination thereof. In example embodiments, the first electrode 181 may have a single layer structure or a multi layer structure, which may include a metal film, an alloy film, a metal nitride film, a conductive metal oxide film and/or a transparent conductive film.

The pixel defining layer PDL may be disposed on the via insulating layer 140 on which the first electrode 181 is disposed. The pixel defining layer PDL may be formed using an organic material. For example, the pixel defining layer PDL may include photoresist, acryl-based resin, polyimide-based resin, polyamide-based resin, siloxane-based resin, etc. In some example embodiments, an opening of the pixel defining layer PDL which exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is located may correspond to the emitting area, and the non-emitting area may correspond to a portion adjacent to the opening of the pixel defining layer PDL.

The light emitting layer 182 may be disposed on the first electrode 181 exposed through the opening of the pixel defining layer PDL. In addition, the light emitting layer 182 may extend on a sidewall of the opening of the pixel defining layer PDL. For example, the light emitting layer 182 may be substantially uniform but extend upward to cover left and right sides of the pixel defining layer PDL. In some example embodiments, the light emitting layer 182 may include an organic light emitting layer (EL), a hole injection layer (HIL), a hole transfer layer (HTL), an electron transfer layer (ETL), an electron injection layer (EIL), etc. In some example embodiments, except for the organic emission layer, the hole injection layer, the hole transport layer, the electron transport layer, and the electron injection layer may be formed in common to correspond to a plurality of pixels. In some example embodiments, a plurality of organic light emitting layers may be formed using light emitting materials for generating different colors of light such as a red color of light, a green color of light and a blue color of light in accordance with color pixels of the display device. In some example embodiments, the organic light emitting layer of the of the light emitting layer 182 may include a plurality of stacked light emitting materials for generating a red color of light, a green color of light and a blue color of light to thereby emit a white color of light. Here, elements of the light emitting layer 182 are commonly formed so as to correspond to a plurality of pixels, and each pixel can be divided by a color filter layer.

The second electrode 183 may be disposed on the pixel defining layer PDL and the light emitting layer 182. For example, the second electrode 183 may cover the pixel defining layer PDL and the light emitting layer 182. The second electrode 183 may include a transmissive material or a reflective material in accordance with the emission type of the display device. For example, the second electrode 183 may be formed using materials such as aluminum, alloy containing aluminum, aluminum nitride, silver, an alloy containing silver, tungsten, tungsten nitride, copper, an alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in a combination thereof. In example embodiments, the second electrode 183 may also have a single layer structure or a multi layer structure, which may include a metal film, an alloy film, a metal nitride film, a conductive metal oxide film and/or a transparent conductive film.

The thin film encapsulation layer 190 may be disposed on the second electrode 183. For example, the thin film encapsulation layer 190 may cover the electrode 183. The thin film encapsulation layer 190 may prevent penetration of moisture and oxygen from outside. The thin film encapsulation layer 190 may include at least one organic layer and at least one inorganic layer. The at least one organic layer and the at least one inorganic layer may be alternately stacked with each other. In the present embodiment, the thin film encapsulation layer 190 includes a first inorganic layer 191, a second inorganic layer 193, and an organic layer 192 between the first inorganic layer 191 and the second inorganic layer 193.

In an embodiment, the display apparatus further includes a polarizing film layer 210, an adhesive layer 220, and a cover window 230 disposed on the display panel 10. The polarizing film layer 210 may be adhered on the thin film encapsulation layer 190. The adhesive layer 220 may be disposed between the cover window 230 and the polarizing film layer 210 and adhered to the cover window 230 and the polarizing film layer 210.

Figure 4:
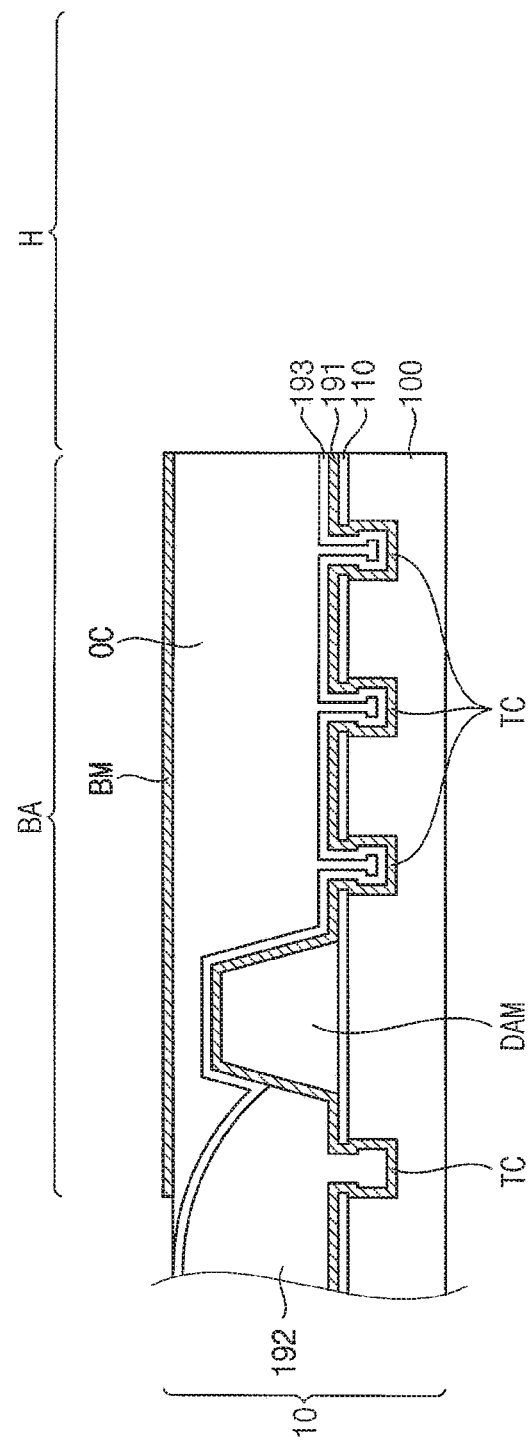
FIG. 4 is a cross-sectional view illustrating opening area H and an opening peripheral area BA of the display panel of the display apparatus of FIG. 1.

FIG. 4 is a cross-sectional view illustrating opening area H and an opening peripheral area BA of the display panel of the display apparatus of FIG. 1, according to an embodiment of the inventive concept.

Referring to FIGS. 1 to 4, the display panel 10 includes the base substrate 100, the buffer layer 110, a dam DAM, the first inorganic layer 191 and the second inorganic layer 193 of the thin film encapsulation layer 190, a planarization layer OC, and a light blocking pattern BM.

In an embodiment, a plurality of grooves TC that are around a periphery of the opening area H are formed on the base substrate 100 in a plan view in the opening peripheral area BA. A groove TC may be formed by removing a portion of the buffer layer 110 and a portion of the base substrate 100 after the buffer layer 110 is formed. In an embodiment, in a plan view, each groove TC has a somewhat annulus shape that encircles the opening area H and one or more other grooves.

The first and second inorganic layers 191 and 193 of the thin film encapsulation layer 190 with excellent step coverage may be formed along a side surface of the groove TC. In this case, it is possible to ensure long inflow paths and/or crack propagation paths of water and oxygen through the first and second inorganic layers 191 and 193. Accordingly, it is possible to provide a display apparatus which is improved in reliability and stability by securing a long time for moisture, oxygen, and cracks to flow into the internal elements along the first and second inorganic layers 191 and 193. The first inorganic layer 191 may be formed within the grooves TC to partially fill in the grooves TC. The second inorganic layer 193 may be formed on the first inorganic layer 191 within the grooves TC between the dam DAM and the opening area H.

The dam DAM that is around a periphery of the opening area H in a plan view may be formed in the opening peripheral area BA. The dam DAM may prevent formation of an organic edge tail by controlling a formation position of the organic layer 192 of the thin film encapsulation layer 190. The dam DAM may be formed using a layer such as the via insulating layer 140 and the pixel defining layer PDL. In an embodiment, a cross-section of the dam DAM has a trapezoidal shape. In an embodiment, a bottom side of the dam DAM contacts the buffer layer 110 and the first inorganic layer 191 covers an outer side, an inner side, and a top side of the dam DAM. Further, the second inorganic layer 193 may cover the portions of the first inorganic layer 191 that cover the dam DAM. In an embodiment, the dam DAM is disposed between a pair of grooves TC, where one of the grooves TC of the pair is not covered by the second inorganic layer 193 and the other groove TC of the pair is covered by the second inorganic layer 193. In an embodiment, in a plan view, the dam DAM has a somewhat annulus shape that encircles the opening area H and one or more grooves.

The planarization layer OC may be formed on the second inorganic layer 193 in the opening peripheral area BA to compensate for an overall height of the display apparatus. The planarization layer OC may have a flat upper surface.

In an embodiment, the light blocking pattern BM is disposed on the planarization layer OC. In an embodiment, the light blocking pattern BM is disposed in the opening peripheral area BA so as to be around a periphery of the opening area H. The light blocking pattern BM may include a photoresist composition used as a light blocking material. For example, the light blocking pattern BM may include a photoresist composition comprising a binder resin, a polymerizable monomer, a polymerizable oligomer, a pigment, a dispersant, or a photoinitiator. The pigment may be a black pigment or a black resin may be used.

Figure 5:
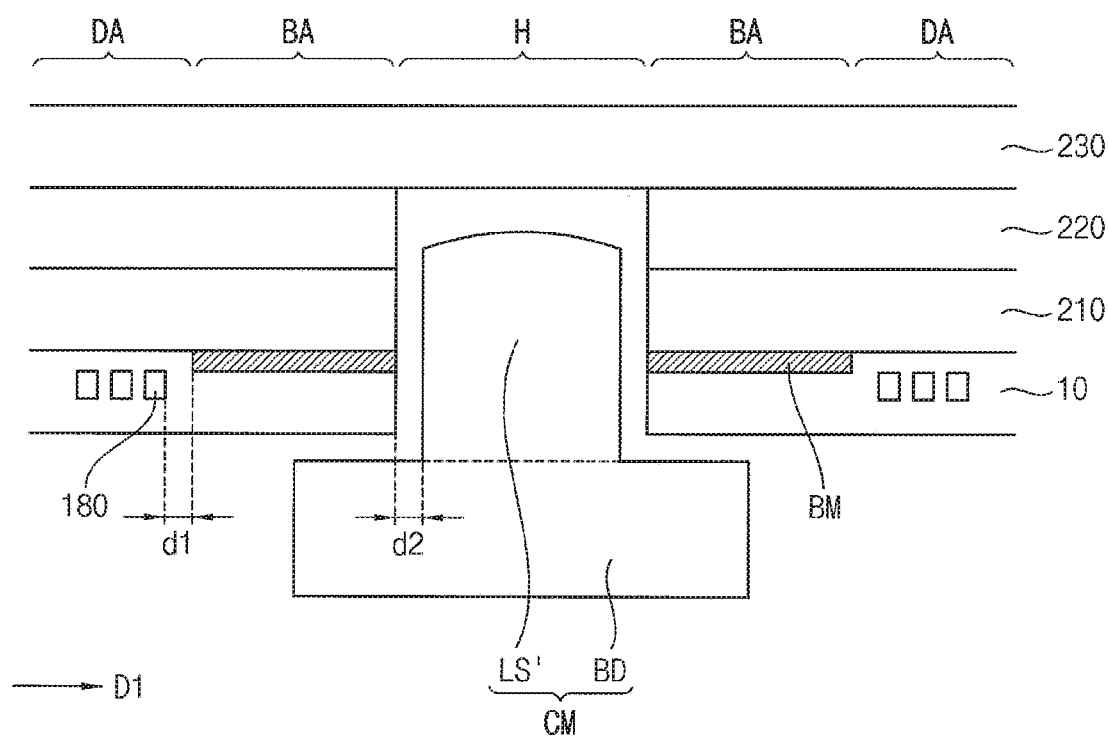
FIG. 5 is a cross-sectional illustrating opening area H and an opening peripheral area BA of the display apparatus according to an embodiment of the inventive concept.

FIG. 5 is a cross-sectional illustrating opening area H and an opening peripheral area BA of the display apparatus according to an embodiment of the inventive concept.

Referring to FIG. 5, the display apparatus is substantially the same as the display apparatus of FIGS. 1 to 4 except for a shape of the lens portion LS' of the optical module CM. Therefore, repeated explanation is omitted.

The display apparatus includes a display panel 10 including a light emitting structure 180 and a light blocking pattern BM, a cover window 230 disposed on the display panel 10, and an optical film layer disposed between the display panel 10 and the cover windows 230. The optical film layer may include a polarizing film layer 210 and an adhesive layer 220.

The optical module CM may be a camera module. The camera module includes a body portion BD below the display panel 10 and a lens portion LS' connected to the body portion BD and disposed in the opening area H.

Here, an upper surface of the lens portion LS' is disposed higher than the light blocking pattern BM. That is, the upper surface of the lens portion LS' may be disposed closer to the cover window 230 than the light blocking pattern BM. Accordingly, an angle of view of the lens portion LS' is not obscured by the light blocking pattern BM so that the size of the opening area H in which the lens portion LS' of the optical module CM is located can be minimized. For example, the lens portion LS' may extend past the light blocking member BM, or may extend past the light blocking member BM and the polarizing film layer 210. Further, an upper surface of the lens portion LS' may be higher than the lower surface of the adhesive layer 220. For example, a distance between an upper surface of the lens portion LS' and the cover window 230 may be smaller than a distance between the light blocking pattern BM and the cover window 230.

FIGS. 6A to 6E are cross-sectional views illustrating a method of manufacturing a display panel of the display apparatus of FIG. 1 according to an embodiment of the inventive concept.

Figure 6A:
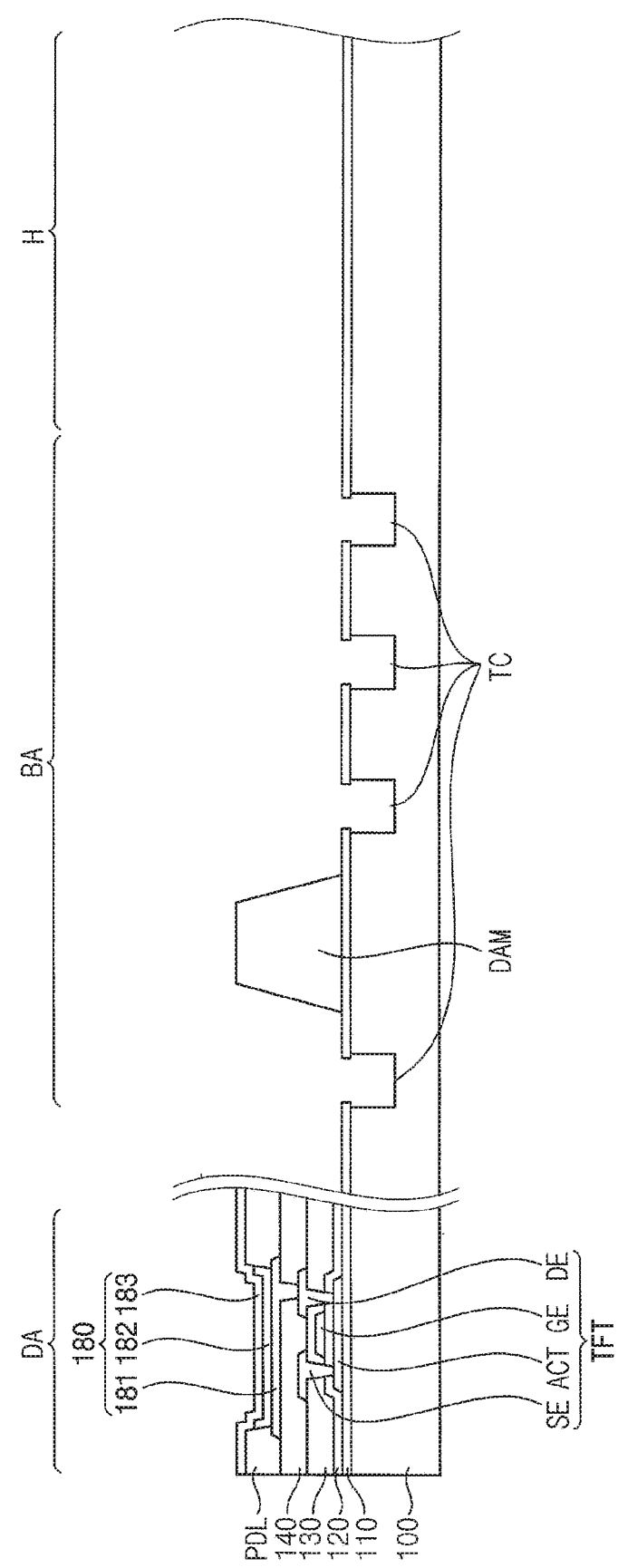
FIGS. 6A to 6E are cross-sectional views illustrating a method of manufacturing a display panel of the display apparatus of FIG. 1.

Referring to FIG. 6A, a buffer layer 110 is formed on a base substrate 100. An active pattern ACT may be formed on the buffer layer 110. A gate insulating layer 120 may be formed on the buffer layer 110 on which the active pattern ACT is formed. A gate pattern including a gate electrode GE may be formed on the gate insulating layer 120. An interlayer insulating layer 130 may be formed on the gate insulating layer 120 on which the gate pattern is formed. A data pattern including a source electrode SE and a drain electrode DE may be formed on the interlayer insulating layer 130. A via insulating layer 140 may be formed on the interlayer insulating layer 130 on which the data pattern is formed. A first electrode 181 may be formed on the via insulating layer 140. A pixel defining layer PDL may be formed on the via insulating layer 140 on which the first electrode 181 is formed. A light emitting layer 182 may be formed on the first electrode 181. A second electrode 183 may be formed on the light emitting layer 182.

In an embodiment, a groove TC is formed by removing a portion the buffer layer 110 and a portion of the base substrate 100 in an opening peripheral area BA, which will be described later. For example, this process may be repeated to form several grooves TC that are spaced apart from one another. A first pair of the grooves TC may be spaced a first distance apart and the rest of the grooves TC may be spaced a second distance apart, where the first distance may be larger than the second distance to accommodate the dam DAM. While FIG. 6A shows two grooves TC between the dam DAM and the opening area H, the inventive concept is not limited thereto. For example, there may be no grooves TC, only one groove TC, or more than two grooves TC between the dam DAM and the opening area H in alternative embodiments.

In addition, a dam DAM is formed in the opening peripheral area. The dam DAM may be formed using a layer such as the via insulating layer 140 and the pixel defining layer PDL. For example, the dam DAM may be formed after the grooves TC are formed. The dam DAM may be formed between a first pair of the grooves TC on the buffer layer 110.

Figure 6B:
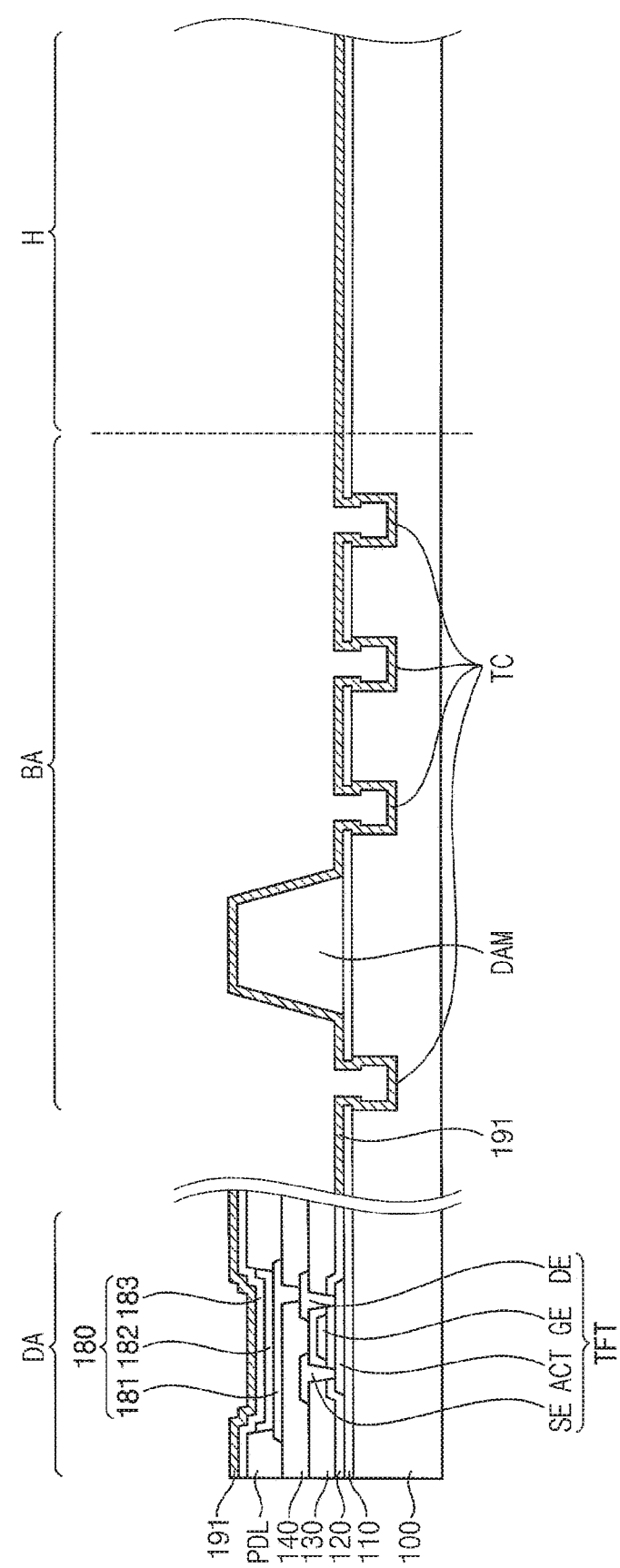

Referring to FIG. 6B, a first inorganic layer 191 is formed on the base substrate 100 on which the first electrode 183 and the dam DAM are formed. The first inorganic layer 191 may be formed corresponding to the entirety of the base substrate 100. For example, the first inorganic layer 191 may be formed to cover the grooves TC and the dam DAM. For example, the first inorganic layer 191 may be formed to contact an interior of the grooves TC and to contact an outside, and inside, and a top side of the dam DAM.

Figure 6C:
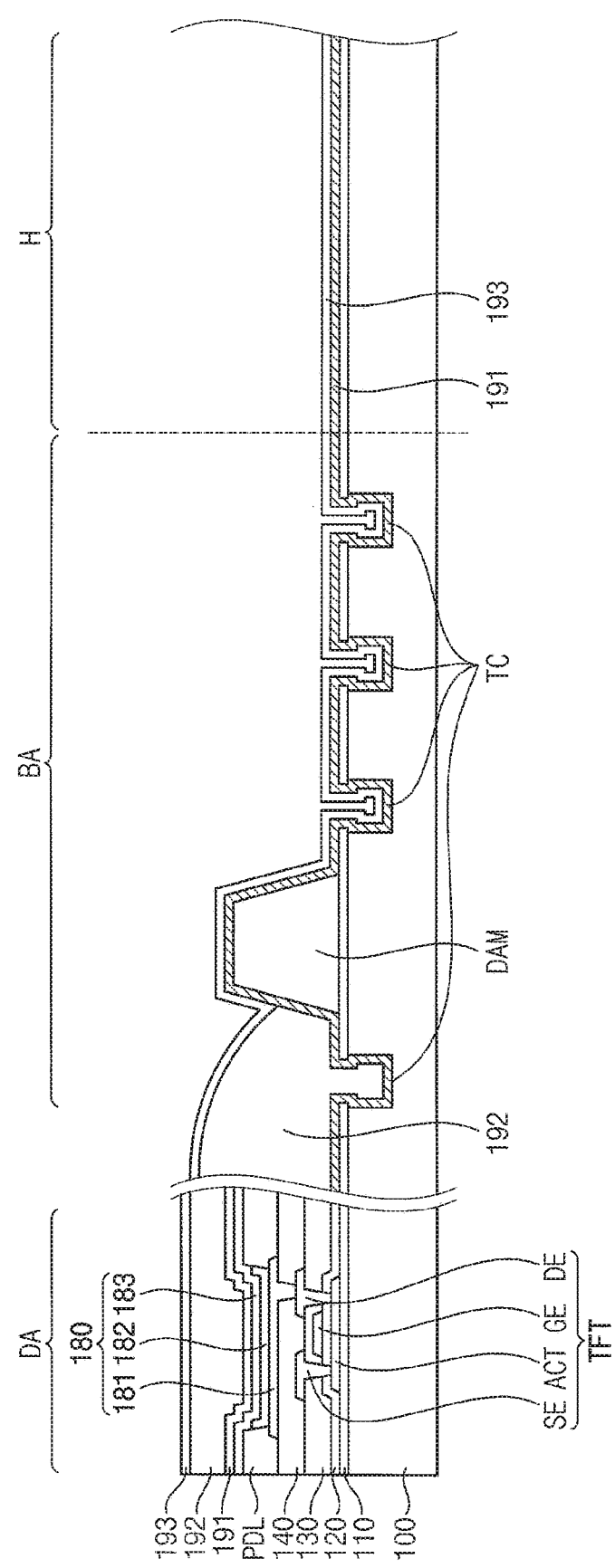

Referring to FIG. 6C, an organic layer 192 is formed on the first inorganic layer 191. In an embodiment, the organic layer 192 is formed only in the display area DA and outside the dam DAM, i.e., toward the display area DA with respect to the dam DAM. That is, the dam DAM may prevent formation of an organic edge tail by controlling the formation position of the organic layer 192.

Thereafter, a second inorganic layer 193 is formed on the organic layer 192 and the first inorganic layer 191. The second inorganic layer 193 may be formed corresponding to the entirety of the base substrate 100. For example, the second inorganic layer 193 may be formed on the organic layer 192 that is between the display area DA and the dam DAM, and the portions of the first organic layer 191 covering the dam DAM and the grooves TC located between the dam DAM and the opening area H.

Figure 6D:
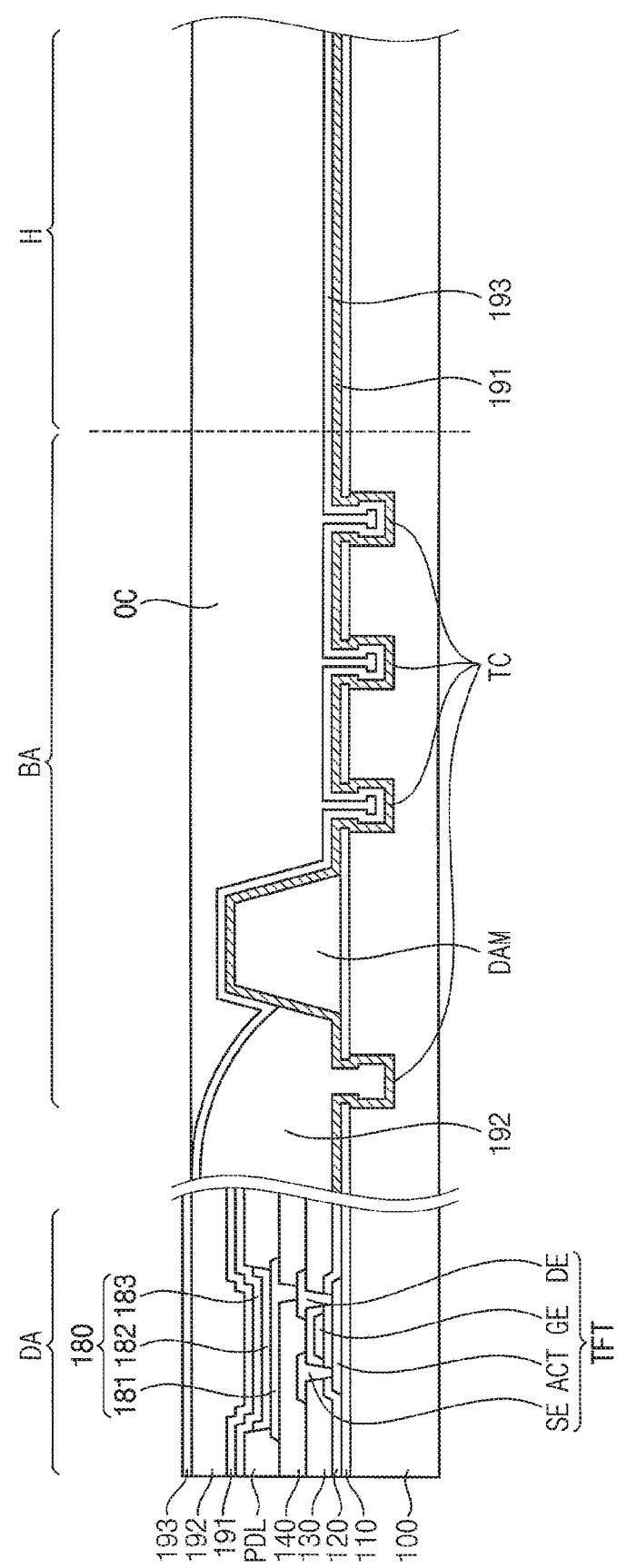

Referring to FIG. 6D, a planarization layer OC is formed on the second inorganic layer 193. The planarization layer OC may be formed on the second inorganic layer 193 in the opening peripheral area BA to compensate for the overall height of the display apparatus. That is, the planarization layer OC may be formed inside of the dam DAM and a periphery of the dam DAM where the organic layer 192 is not formed, and may have a flat upper surface.

Figure 6E:
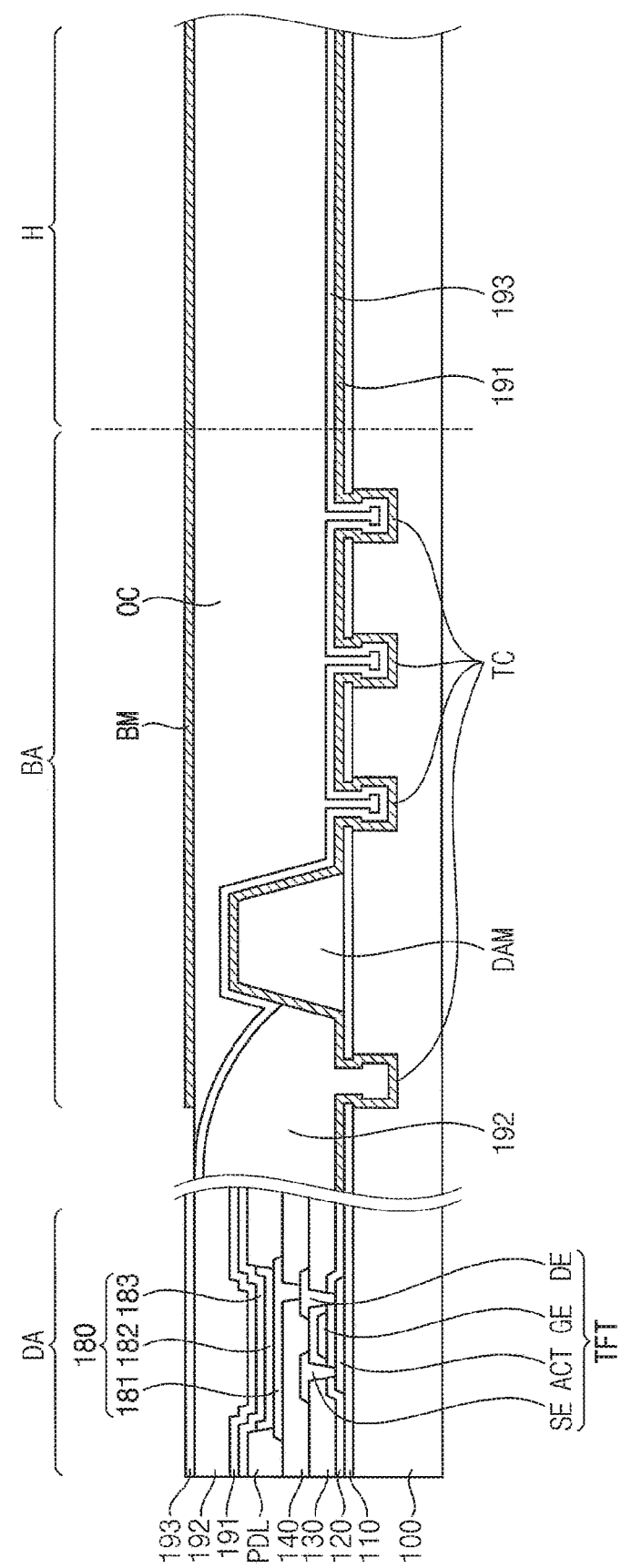

Referring to FIG. 6E, a light blocking pattern BM is formed on the planarization layer OC. In an embodiment, the light blocking pattern BM is formed in the opening peripheral area BA and up to at least a portion of the opening area H.

The light blocking pattern BM may be formed by coating a photoresist composition on the planarization layer OC, forming a light blocking pattern layer, and then exposing and developing the light blocking pattern layer. For example, the light blocking pattern layer may be formed of a negative type photoresist composition in which an unexposed portion is developed. The light blocking pattern BM may be formed by exposing and developing the light blocking pattern layer using a mask (not shown) having an opening corresponding to the opening area H and the opening peripheral area BA.

Thereafter, a portion of the light blocking pattern BM, a portion of the planarization layer OC, a portion of the second inorganic layer 193, a portion of the first inorganic layer 191, a portion of the buffer layer 110, and a portion of the base substrate 100 may be cut to form a hole corresponding to the opening area H. (See the dotted line in the drawing). For example, the portion of the light blocking pattern BM after the dotted line and the layers below may be removed to form the hole so the optical module CM can be inserted into the hole.

Accordingly, a display panel including the gate insulating layer 120, the gate pattern, the interlayer insulating layer 130, the data pattern, the gate insulating layer 120, the via insulation layer 140, the pixel defining layer PDL, the light emitting structure 180, the thin encapsulation layer 190, the dam DAM, and the planarization layer OC may be manufactured.

Then, the display apparatus can be manufactured by forming an optical film layer and a cover window on the display panel. (See FIG. 2). For example, the optical film layer may be formed to cover the display panel 10 and the light blocking member BM, and the cover window 230 may be formed to cover the optical film layer. A region of the optical film layer may cover a first hole that was cut through the portions of the light blocking pattern BM, the planarization layer OC, the second inorganic layer 193, the first inorganic layer 191, the buffer layer 110, and the base substrate 100, and this region may be cut to create a second hole through the optical film layer that coincides with the first hole. According to at least one embodiment of the present inventive concept, structures of the opening peripheral area BA can be prevented from being visible to a user through a process of forming the light blocking pattern BM without a separate design change. Further, since the hole corresponding to the opening area H is formed after the light blocking pattern BM is formed, the light blocking pattern BM may be provided so as to be in contact with the hole. Therefore, the size of the opening area H and the size of the opening peripheral area BA can be minimized.

Figure 7:
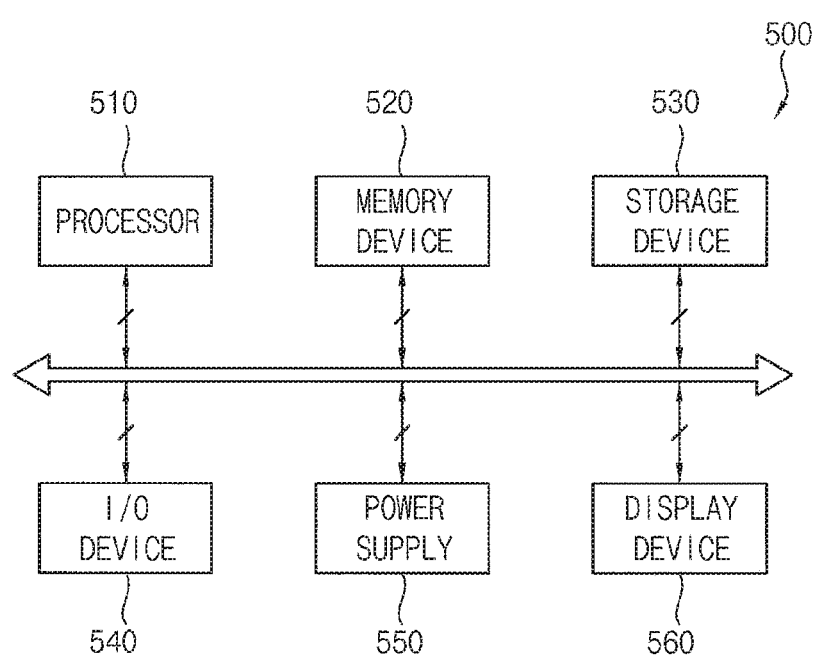
FIG. 7 is a block diagram illustrating an electronic device according to example embodiments.
Figure 8A:
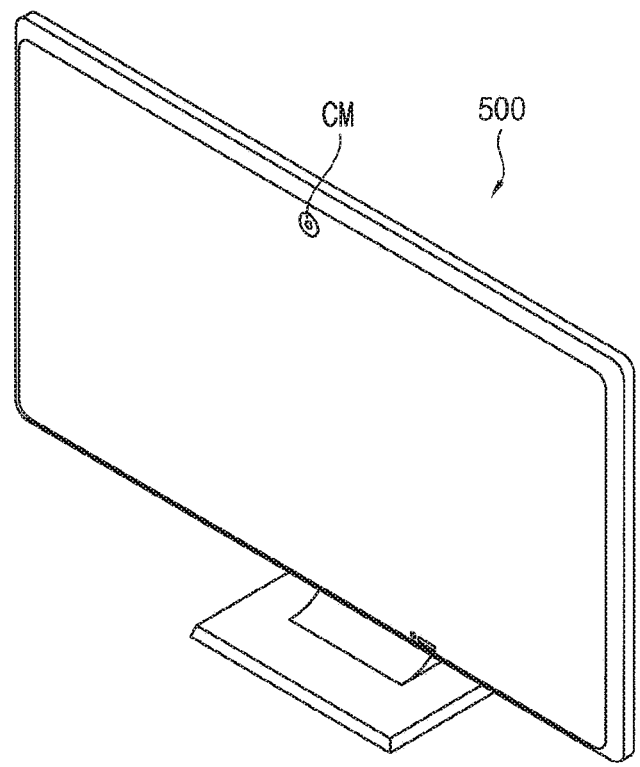
FIG. 8A is a diagram illustrating an example in which the electronic device of FIG. 7 is implemented as a television.
Figure 8B:
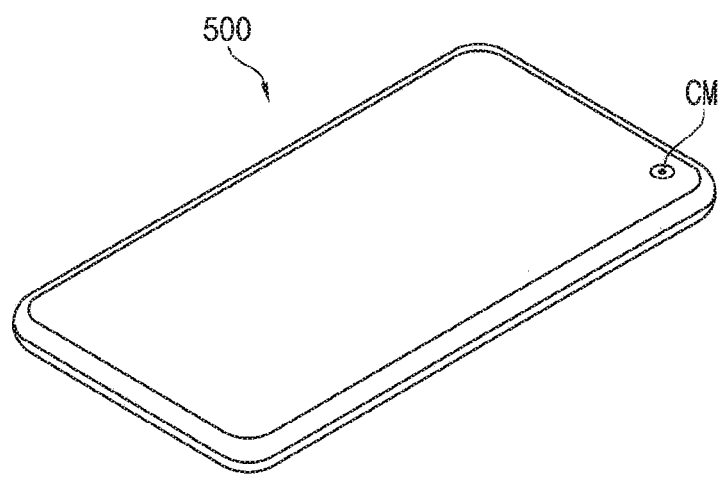
FIG. 8B is a diagram illustrating an example in which the electronic device of FIG. 7 is implemented as a smart phone.

FIG. 7 is a block diagram illustrating an electronic device according to an embodiment of the inventive concept. FIG. 8A is a diagram illustrating an example in which the electronic device of FIG. 7 is implemented as a television. FIG. 8B is a diagram illustrating an example in which the electronic device of FIG. 7 is implemented as a smart phone.

Referring to FIGS. 7 through 8B, the electronic device 500 includes a processor 510, a memory device 520, a storage device 530, an input/output (I/O) device 540, a power supply 550, and a display apparatus 560. Here, the display apparatus 560 may correspond to the display apparatus of FIG. 1. In addition, the electronic device 500 may further include a plurality of ports for communicating with a video card, a sound card, a memory card, a universal serial bus (USB) device, other electronic devices, etc. In an embodiment, as illustrated in FIG. 8A, the electronic device 500 is implemented as a television. In another embodiment, as illustrated in FIG. 8B, the electronic device 500 is implemented as a smart phone. However, the electronic device 500 is not limited thereto. For example, the electronic device 500 may be implemented as a cellular phone, a video phone, a smart pad, a smart watch, a tablet personal computer (PC), a car navigation system, a computer monitor, a laptop, a head mounted display (HMD), etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc and an output device such as a printer, a speaker, etc. The power supply 550 may provide power for operations of the electronic device 500.

The display apparatus 560 may be coupled to other components via the buses or other communication links. In an embodiment of the inventive concept, the display apparatus 560 is included in the I/O device 540.

In addition, the display apparatus 560 of the electronic device 500 may be a display apparatus in which a hole is formed in the display area so that the optical module CM, i.e., a camera, is disposed therein as shown in FIGS. 8A and 8B.

As described above, since the display apparatus 560 includes a base substrate, a display panel including a planarization insulating layer disposed in the opening area peripheral area on the base substrate and a light blocking pattern disposed on the planarization insulating layer in the opening area peripheral area, it is possible to provide a display apparatus in which the display area is enlarged even if the non-display area is reduced.

The foregoing is illustrative of the inventive concept and is not to be construed as limiting thereof. Although a few embodiments of the inventive concept have been described, those skilled in the art will readily appreciate that many modifications are possible in the embodiments without materially departing from the inventive concept. Accordingly, all such modifications are intended to be included within the scope of the inventive concept.

What is claimed is:

1. A display apparatus, comprising:
    a display panel including an opening area through which light passes, a non-display area comprising an opening peripheral area that is around a periphery of the opening area, and a display area including at least one pixel, the display area being around a periphery of the opening peripheral area;
    an optical module disposed to overlap the opening area;
    an optical film layer disposed on the display panel; and
    a cover window disposed on the optical film layer,
    wherein the display panel comprises:
        a base substrate;
        a light emitting structure disposed on the base substrate;
        a planarization insulating layer disposed on the substrate in the opening peripheral area; and
        a light blocking pattern disposed on the planarization insulating layer in the opening peripheral area,
        wherein the light blocking pattern extends beyond a body portion of the optical module.

2. The display apparatus of claim 1, wherein the light blocking pattern comprises a photoresist composition.

3. The display apparatus of claim 1, wherein the base substrate comprises at least one polyimide layer and at least one barrier layer alternately stacked with each other.

4. The display apparatus of claim 1, the base substrate comprises a groove in the opening peripheral area that is around a periphery of the opening area.

5. The display apparatus of claim 1, wherein the optical film comprises a polarizing film layer and an adhesive layer disposed between the polarizing film layer and the cover window.

6. The display apparatus of claim 1, further comprising:
    a dam disposed on the base substrate in the opening peripheral area, and being around a periphery of the opening area; and
    a thin film encapsulation layer including a first inorganic layer disposed on the light emitting structure, an organic layer disposed on the first inorganic layer, and a second inorganic layer disposed on the organic layer, and wherein the organic layer is only disposed outside the dam with reference to the opening area.

7. The display apparatus of claim 1, wherein the display panel and the optical film layer include a through-hole, the optical module includes a lens portion and a body portion, wherein a portion of the lens portion is disposed in the through-hole, and the body portion is disposed under the display panel.

8. The display apparatus of claim 7, wherein a distance between an upper surface of the lens portion and the cover window is smaller than a distance between the light blocking pattern and the cover window.

9. The display apparatus of claim 1, wherein the base substrate and the light blocking pattern include a hole, and the light blocking pattern contacts the hole.

10. A method of manufacturing a display apparatus, comprising:
    forming a thin film transistor on a base substrate in a display area, wherein the base substrate includes an opening area, an opening peripheral area that is around a periphery of the opening area, and the display area that is around a periphery of the opening peripheral area;

forming a light emitting structure electrically connected to the thin film transistor;
forming a thin film encapsulation layer on the light emitting structure;
  forming a planarization layer on the thin film encapsulation layer in the opening peripheral area;
  forming an optical module to overlap the opening area; and
  forming a light blocking layer on the planarization layer in the opening peripheral area to extend beyond a body portion of the optical module.

11. The method of claim 10, wherein forming the light blocking layer comprises:
  forming a light blocking pattern layer by coating a photoresist composition on the planarization layer; and
  exposing and developing the light blocking pattern layer to form the light blocking pattern.

12. The method of claim 11, wherein the light blocking pattern layer includes a negative type photoresist composition in which an unexposed portion is developed, and the light blocking pattern layer is exposed using a mask having an opening corresponding to the opening area.

13. The method of claim 11, further comprising:
  forming a hole corresponding to the opening area by removing a portion of the light blocking pattern, a portion of the planarization layer, a portion of the thin film encapsulation layer, and a portion of the base substrate, after forming the light blocking pattern.

14. The method of claim 10, further comprising:
  forming a dam disposed on the base substrate in the opening peripheral area to be around a periphery of the opening area in a plan view, before forming the thin film encapsulation layer.

15. The method of claim 14, wherein forming the thin film encapsulation layer comprises:
  forming a first inorganic insulating layer on the light emitting structure, and the dam;
  forming an organic layer on the first inorganic layer outside the dam in a plan view; and
  forming a second inorganic insulating layer on the organic layer and the first inorganic layer.

16. The method of claim 14, further comprising:
  forming a groove on the base substrate that is around a periphery of the opening area in the opening peripheral area, before forming the thin film encapsulation layer.

17. The method of claim 10, wherein forming the light emitting structure comprises:
  forming a first electrode electrically connected to the thin film transistor; forming a light emitting layer on the first electrode; and
  forming a second electrode on the light emitting layer.

18. The method of claim 10, further comprising:
  forming an optical film layer on the light blocking pattern and thin film encapsulation layer; and
  forming a cover window on the optical film layer.

19. A display apparatus, comprising:
  a display panel including a base substrate and an opening area through which light passes, a non-display area comprising an opening peripheral area that is around a periphery of the opening area, and a display area including at least one pixel, the display area being around a periphery of the opening peripheral area;
  a dam located in the opening peripheral area between a first groove on the base substrate and a plurality of second grooves spaced apart from one another on the base substrate;
  a polarizer disposed on the display panel; and
  a cover window disposed on the polarizer, wherein the display panel comprises a light blocking pattern disposed between the polarizer and the display panel in the opening peripheral area, the light blocking pattern being around a periphery of an opening within the opening area.

20. The display apparatus of claim 19, wherein the display panel further comprises a camera including a body portion and a lens portion, the camera disposed under the display panel, the body portion disposed within the opening peripheral area, the lens portion is located in the opening area.

21. The display apparatus of claim 20, wherein an upper surface of the lens portion is below the light blocking pattern.

22. The display apparatus of claim 20, wherein an upper surface of the lens portion is above the polarizer.

23. The display apparatus of claim 1, wherein the display panel further comprises a dam located in the opening peripheral area between grooves on the base substrate.

24. The method of claim 14, wherein the dam is formed between a pair of grooves in the base substrate.

* * * * *